(12) United States Patent
Hung et al.

(10) Patent No.: US 8,357,988 B2
(45) Date of Patent: Jan. 22, 2013

(54) DIE SEAL RING

(75) Inventors: Cheng-Chou Hung, Hsinchu County (TW); Victor-Chiang Liang, Hsin-Chu (TW); Jui-Meng Jao, Miao-Li Hsien (TW); Cheng-Hung Li, Kaohsiung County (TW); Sheng-Yi Huang, Hsinchu County (TW); Tzung-Lin Li, Pingtung County (TW); Huai-Wen Zhang, Taoyuan County (TW); Chih-Yu Tseng, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 78 days.

(21) Appl. No.: 12/366,654

(22) Filed: Feb. 6, 2009

(65) Prior Publication Data

US 2010/0200947 A1  Aug. 12, 2010

(51) Int. Cl.
*H01L 21/70* (2006.01)

(52) U.S. Cl. ......... 257/510; 257/374; 257/501; 257/506

(58) Field of Classification Search .................. 257/374, 257/501, 506, 510, E29.02
See application file for complete search history.

(56) References Cited

U.S. PATENT DOCUMENTS

| | | | |
|---|---|---|---|
| 5,834,829 A | 11/1998 | Dinkel | |
| 6,025,639 A | 2/2000 | Mitwalsky | |
| 7,485,941 B2 * | 2/2009 | Levin et al. | 257/476 |
| 2006/0038271 A1 * | 2/2006 | Hsu | 257/686 |
| 2006/0102980 A1 * | 5/2006 | Nakashiba | 257/508 |
| 2006/0220250 A1 | 10/2006 | Kim | |
| 2007/0241422 A1 * | 10/2007 | Chen | 257/528 |

* cited by examiner

*Primary Examiner* — Tan N Tran
(74) *Attorney, Agent, or Firm* — Winston Hsu; Scott Margo

(57) ABSTRACT

A die seal ring disposed outside of a die region of a semiconductor substrate is disclosed. The die seal ring includes a first isolation structure, a second isolation structure, and at least one third isolation structure disposed between the first isolation structure and the second isolation structure; a plurality of first regions between the first isolation structure, the second isolation structure and the third isolation structure; a second region under the first region and the third isolation structure; and a third region under the first isolation structure.

18 Claims, 7 Drawing Sheets

DIE SEAL RING

BACKGROUND OF THE INVENTION

1. Field of the Invention

The invention relates to a die seal ring, and more particularly, to a die seal ring capable of blocking noise.

2. Description of the Prior Art

Today the functionality and economics of many consumer products are being transformed by "system-on-chip" (SoC) technology. The continuing increase in the transistor densities means that it is now possible to integrate the processor, peripherals and some or all of the system memory on a single chip.

SoC is an idea of integrating all components of a computer or other electronic system into a single integrated circuit chip. It may contain micro processing core, MPEG core, memory, digital/analog circuits, mixed-signal circuits, and often radio-frequency functions—all on one chip. SoC is believed to be more cost effective since it increases the yield of the fabrication and also its packaging is less complicated.

Referring to FIGS. 1, FIG. 1 illustrates a top view of a SoC structure according to the prior art. As shown in FIG. 1, a semiconductor substrate 12, such as a silicon wafer is provided, in which a die region 14, a die seal ring region 16, and a scribe line region 18 are defined on the semiconductor substrate 12. A plurality of I/O pads 26 is disposed on the periphery of the die within the die region 14. The scribe line region 18 is formed on the exterior side of the die region 14 and the die seal ring region 16 and surrounds the entire die seal ring. The die seal ring region 16 is disposed between the die region 14 and the scribe line region 18, such that the die seal ring could be used as a blocking wall for protecting the die region from external stress while the wafer is diced. The scribe line region 18 is specifically divided into two parts, including a first part 20 and a second part 22. The first part 20 of the scribe line region 18 is adjacent to the die seal ring region 16, in which this part 20 would not be diced by dicing tool while the wafer is diced. The second part 22 is positioned on the exterior side of the first part 20 and a plurality of wafer acceptance test pads 24 are placed on the second part 22 for testing purpose. For illustration purpose, only four pads 24 are shown in FIG. 1. The second part 22 is preferably diced by dicing tool while the wafer is diced along the scribe line region 18.

As the I/O pads 26 disposed in the die region 14 from the above SoC design is immediately adjacent to the die seal ring region 16, noise caused by the I/O pads 26 would easily pass around the die seal ring and expand to the peripheral region and affect the operation of the device. Hence, there is a need in this industry to provide a solution that the noise expansion problems can be addressed or eliminated as early as possible during the design phase both on the aspect of the cost and on aspect of the time-to-market of the products.

SUMMARY OF THE INVENTION

It is an objective of the present invention to provide a die seal ring for solving the aforementioned problems.

According to a preferred embodiment of the present invention, a die seal ring disposed outside of a die region of a semiconductor substrate is disclosed. The die seal ring includes a first isolation structure, a second isolation structure, and at least one third isolation structure disposed between the first isolation structure and the second isolation structure; a plurality of first regions between the first isolation structure, the second isolation structure and the third isolation structure; a second region under the first region and the third isolation structure; and a third region under the first isolation structure.

The present invention specifically forms wells of different conductive type, such as a p-well and an n-well under shallow trench isolations and in the semiconductor substrate of the die seal ring region. Preferably, energy difference created between these wells of different conductive type could be used to block noise transmitted from the die region. Moreover, doping regions of different conductive type and Schottky contacts could be formed on top of the aforementioned wells and between the shallow trench isolations, and deep wells of deeper depths could be formed under the aforementioned wells. The doping regions, wells, and deep wells could be composed of dopants of same or difference conductive type depending on the design of the product.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
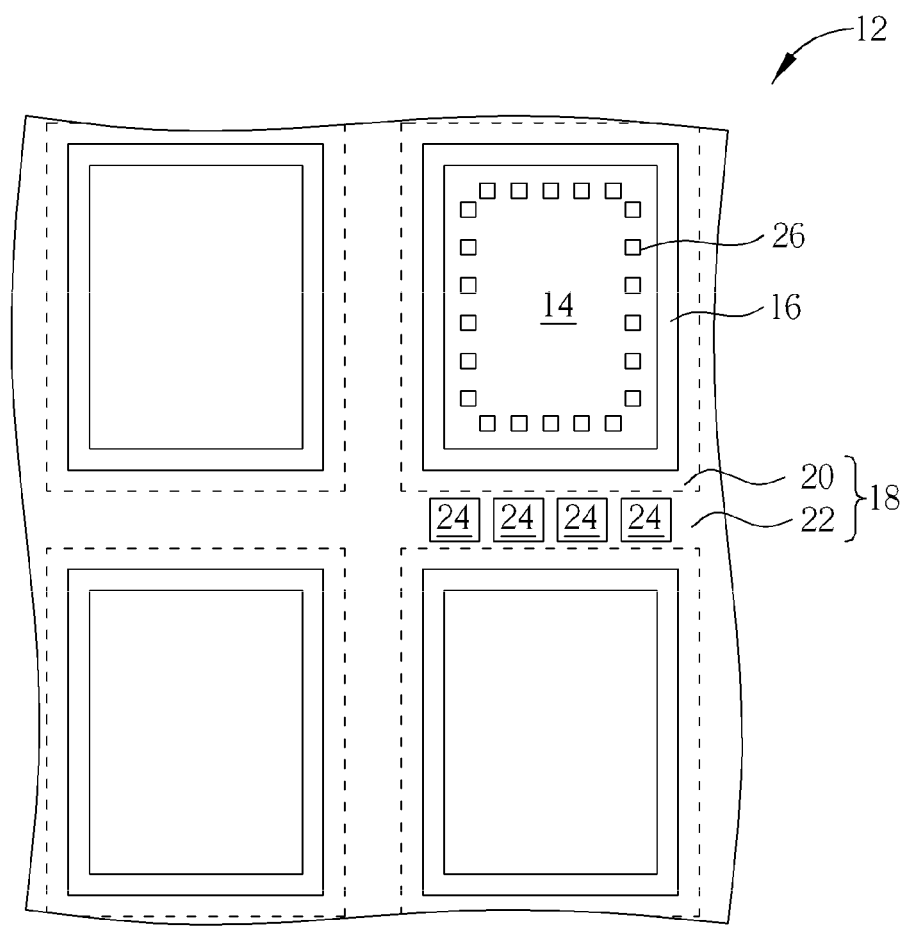
FIG. 1 illustrates a top view of a SoC structure according to the prior art.
Figure 2:
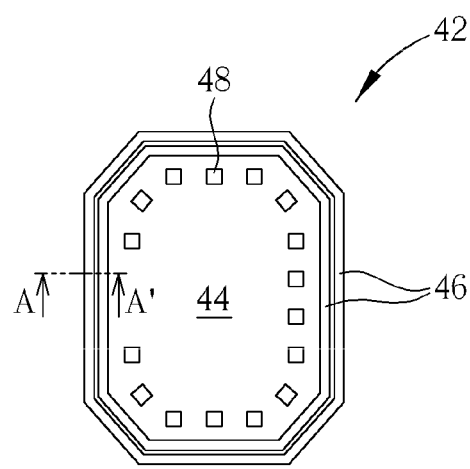
FIG. 2 illustrates a top view of a die seal ring according to a first embodiment of the present invention.
Figure 3:
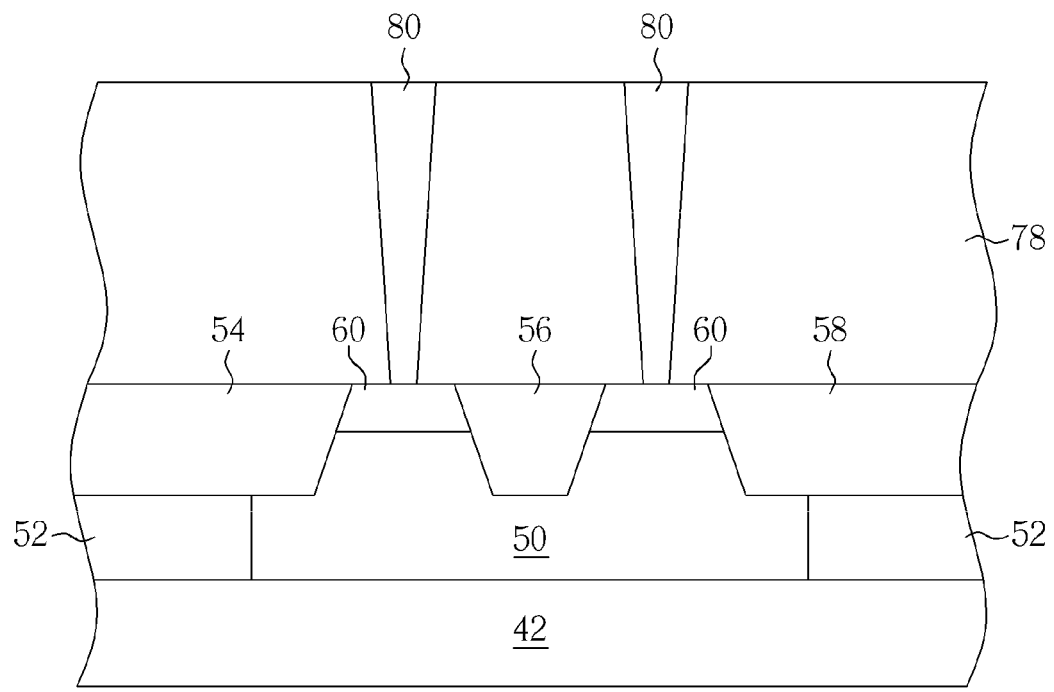
FIG. 3 illustrates a cross-section view of the die seal ring shown in FIG. 2 along the sectional line AA'.

Referring to FIGS. 2-3, FIGS. 2 illustrate a top view of a die seal ring according to a first embodiment of the present invention, FIG. 3 illustrates a cross-section view of the die seal ring shown in FIG. 2 along the sectional line AA'. As shown in FIGS. 2-3, a semiconductor substrate 42, such as a p-type semiconductor substrate is provided, and a die region 44 (only one die region is shown in FIG. 2 for sake of brevity) and a die seal ring region 46 is defined on the semiconductor substrate 42. The die region 44 includes a circuit region (not shown) and the die seal ring region 46 is formed to surround the die region 42 with a substantially octagonal shape. Next, an isolation fabrication, such as shallow trench isolation fabrication process conducted in the circuit region is performed to form a plurality of shallow trench isolations 54, 56, 58 in substantially surface region of the semiconductor substrate 42. An ion implantation, such as ion implantations conducted for forming p-well and n-well in the circuit region is performed to form a p-well 50 and a n-well 52 in the semiconductor substrate 42 of the die seal ring region 46. Another ion implantation, such as an ion implantation conducted in the circuit region for forming a PMOS source/drain, is performed to form a plurality of P+ doping regions 60 between the shallow trench isolations 54, 56, 58. A contact plug fabrication process performed in the die region 44 could be utilized to form a plurality of contact plugs in the die seal ring region 46. For instance, an interlayer dielectric layer 78 and a plurality of contact plugs 80 embedded in the interlayer dielectric layer 78 could be formed to connect the P+ doping region 60, which is also within the scope of the present invention. The contact plugs 80 could be further connected to via bars and metal bars of the metal interconnective structure and the details of which are not explained herein for sake of brevity. A contact pad fabrication is performed thereafter to form a plurality of I/O pads 48 within the die region 44.

In this embodiment, the P+ doping regions 60 are disposed between the shallow trench isolations 54, 56, 58, the p-well 50 is disposed in the semiconductor substrate 42 under the P+ doping regions 60 and the shallow trench isolations 54, 56, 58, and the n-well 52 is disposed in the semiconductor substrate 42 under the shallow trench isolations 54 and 58 while surrounding the p-well 50. As a PN junction is formed between the n-well 52 and the p-well 50 and the fact that different Fermi level is observed between the two wells 52 and 50, the present invention could utilize this energy difference between these wells 50, 52 of different conductive type to block noise transmitted by the I/O pads 48 of the die region 44. According to an embodiment of the present invention, the step of utilizing p-type dopants to form the p-well 50 could be omitted by replacing the p-well 50 with p-type semiconductor substrate 42. In this case, the n-well 52 would be formed around the p-type semiconductor substrate 42 and the P+ doping regions 60 and shallow trench isolations 54, 56, 58 would still be formed above the p-type semiconductor substrate 42. This design is also within the scope of the present invention.

Figure 4:
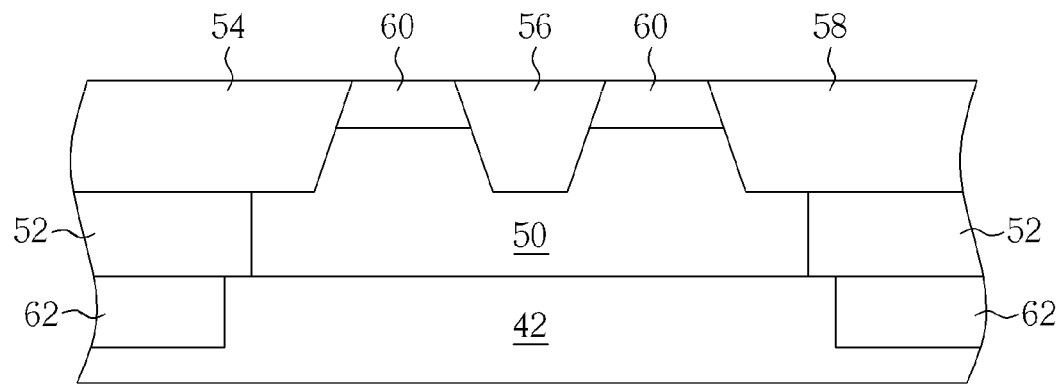
FIGS. 4-5 illustrate a cross-section of a die seal ring according to an embodiment of the present invention.
Figure 5:
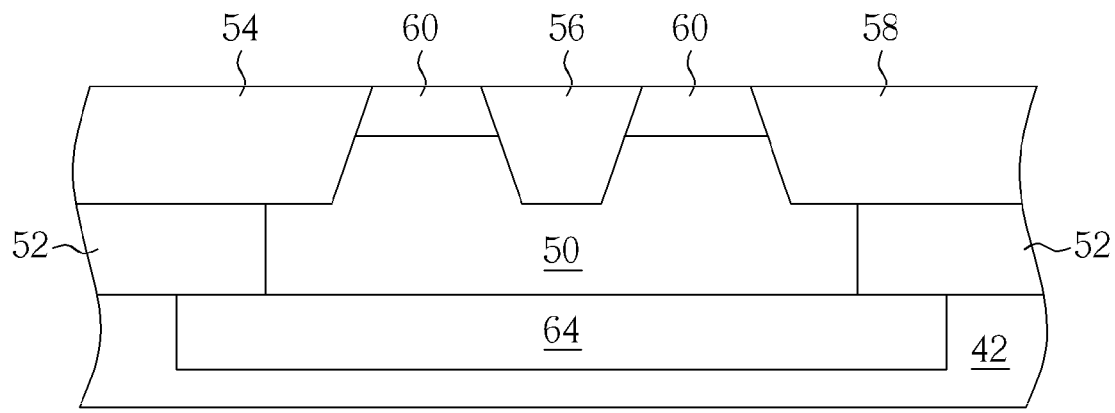

Referring to FIGS. 4-5, FIGS. 4-5 illustrate a cross-section of a die seal ring according to an embodiment of the present invention. First, a p-type semiconductor substrate 42 is provided, and after shallow trench isolation fabrication a n-type ion implantation is conducted to form a deep n-well 62 in substantially edge region of the semiconductor substrate 42 of the die seal ring region 46, as shown in FIG. 4, or a deep n-well 64 in the substantially central region of the semiconductor substrate 42 of the die seal ring region 46, as shown in FIG. 5. N-type and p-type ion implants are conducted thereafter to form a p-well 50 and a n-well 52 above the deep n-wells 62 and 64. Next, another ion implantation is conducted to form a plurality of P+ doping regions 60 between the shallow trench isolations 54, 56, 58 within the p-well 50. It should be noted that the aforementioned fabrication processes disclosed in this embodiment could be conducted independently or along with semiconductor fabrication processes conducted in the circuit region. Moreover, a plurality of contact plugs (not shown) could also be formed to electrically connect to the P+ doping regions 60.

In the embodiment shown in FIGS. 4-5, the P+ doping region 60 is disposed between the shallow trench isolations 54, 56, 58, the p-well 50 is disposed in the semiconductor substrate 42 under both the P+ doping region 60 and the shallow trench isolations 54, 56, 58, and the n-well 52 is formed in the semiconductor substrate 42 under the shallow trench isolations 54 and 58 while surrounding the p-well 50. In the embodiment shown in FIG. 4, the deep n-well 62 is disposed in the semiconductor substrate 42 directly under the n-well 52 whereas in the embodiment shown in FIG. 5, the deep n-well 64 is disposed in the semiconductor substrate 42 directly under the p-well 50 and under a portion of the n-well 52.

Figure 6:
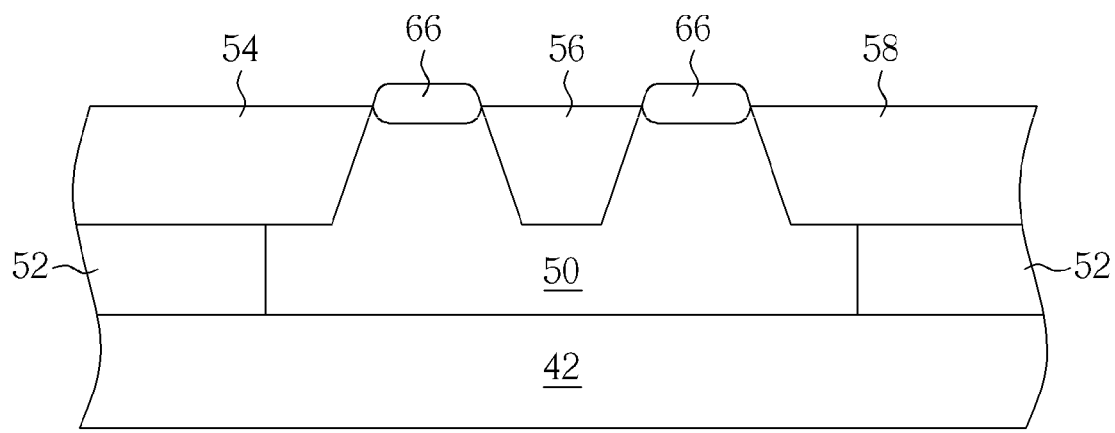
FIG. 6 illustrates a cross-section view of a die seal ring by replacing P+ doping region with Schottky contact according to an embodiment of the present invention.

Referring to FIG. 6, FIG. 6 illustrates a cross-section view of a die seal ring by replacing P+ doping region with Schottky contact according to an embodiment of the present invention. As shown in FIG. 6, a p-type semiconductor substrate 42 is provided, and after shallow trench isolation fabrication, a p-well 50 and a n-well 52 is formed by ion implants in the semiconductor substrate 42 of the die seal ring region 46. A salicide process is performed to form a plurality of Schottky contacts 66 on surface of the p-well 50 and between the shallow trench isolations 54, 56, 58. For instance, the salicide process conducted in the die region 44 could be utilized to first form a metal layer (not shown) composed of cobalt, titanium, nickel, platinum, palladium, or molybdenum on surface of the semiconductor substrate 42 of the die seal ring region 46, and a thermal treatment is conducted to react the metal layer with surface of the semiconductor substrate 42 to form a plurality of Schottky contacts 66. Un-reacted metal layer is removed thereafter. In this embodiment, as no doping region is formed with respect to the surface of the semiconductor substrate 42, the Schottky contact 66 would produce an effect similar to the aforementioned PN junction, which could be further utilized for blocking noised transmitted from the I/O pads 48 of the die region 44.

Figure 7:
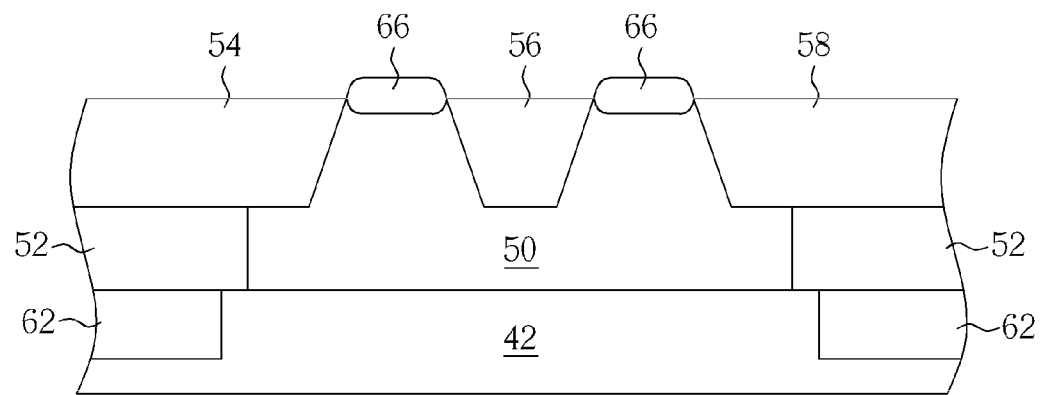
FIGS. 7-8 illustrate a cross-section view of a die seal ring according to an embodiment of the present invention.
Figure 8:
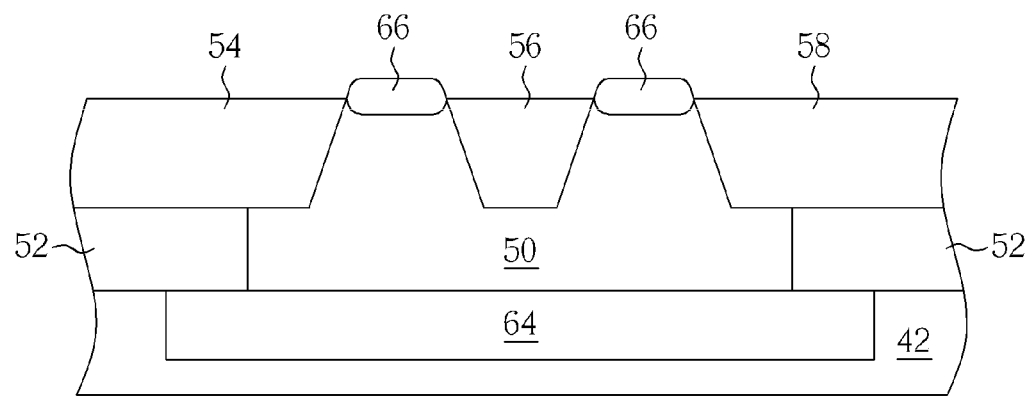

Referring to FIGS. 7-8, FIGS. 7-8 illustrate a cross-section view of a die seal ring according to an embodiment of the present invention. As shown in FIGS. 7-8, the fabrication of Schottky contact shown in FIG. 6 and the deep n-well fabrication shown in FIGS. 4-5 could be combined to form other die seal ring designs. For instance, after shallow trench isolation fabrication, a deep n-well 62 could be formed in the p-type semiconductor substrate 42 of the die seal ring region 46, as shown in FIG. 7, or a deep n-well 64 formed in the substantially central region of the semiconductor substrate 42 of the die seal ring region 46, as shown in FIG. 8. N-type and p-type ion implantations are conducted thereafter to form a p-well 50 and a n-well 52 on top of the deep n-wells 62, 64, such that the n-well 52 is disposed directly on top of the deep n-well 62, as shown in FIG. 7, or the deep n-well 64 is disposed directly under the p-well 52 and a portion of the n-well 52, as shown in FIG. 8. Next, a Schottky contact fabrication shown in FIG. 6 is conducted to form a plurality of Schottky contacts 66 between the shallow trench isolations 54, 56, 58. It should be noted that the aforementioned fabrication processes disclosed in this embodiment could be conducted independently or along with semiconductor fabrication processes conducted in the circuit region. For instance, a plurality of contact plugs (not shown) could also be formed to electrically connect to the Schottky contacts 66, which is also within the scope of the present invention.

Figure 9:
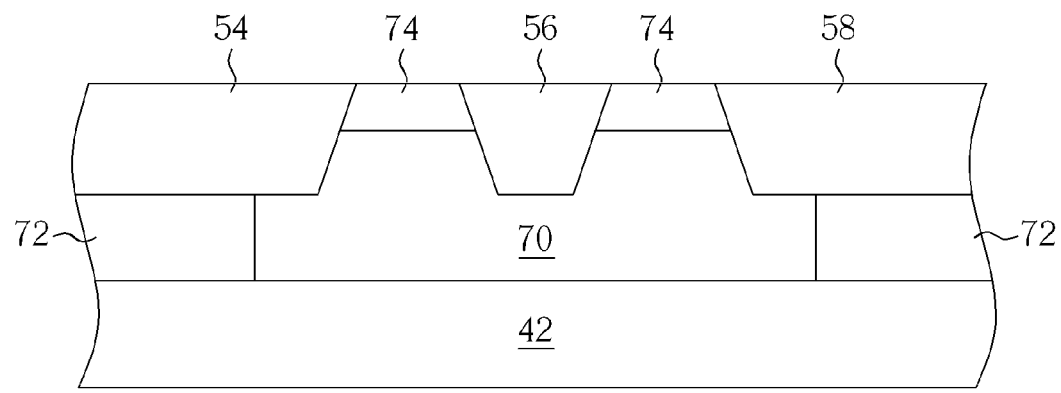
FIGS. 9-12 illustrate a variety of embodiments derived from the embodiment shown in FIG. 3.

Referring to FIGS. 9-12, FIGS. 9-12 illustrate a variety of embodiments derived from the embodiment shown in FIG. 3. As shown in FIG. 9, a p-type semiconductor substrate 42 is provided, and after shallow trench isolation fabrication, n-type and p-type ion implantations are conducted to form a n-well 70 and a p-well 72 surrounding the n-well 70 in the semiconductor substrate 42. Next, another ion implantation is carried out to form a plurality of P+ doping regions 74 between the shallow trench isolations 54, 56, 58. Viewing from a structural perspective, the P+ doping regions 74 are disposed between the shallow trench isolations 54, 56, 58, the n-well 70 is disposed under both the P+ doping regions 74 and the shallow trench isolations 54, 56, 58, and the p-well 72 is disposed directly under the shallow trench isolations 54, 58 while surrounding the n-well 70. As a PN junction is formed between the n-well 70 and the p-well 72 and another PN junction is formed between the n-well 70 and the P+ doping region 74, the energy difference created between these PN junctions could be utilized to inhibit noise passed out by the I/O pads 48 from the die region 44.

Figure 10:
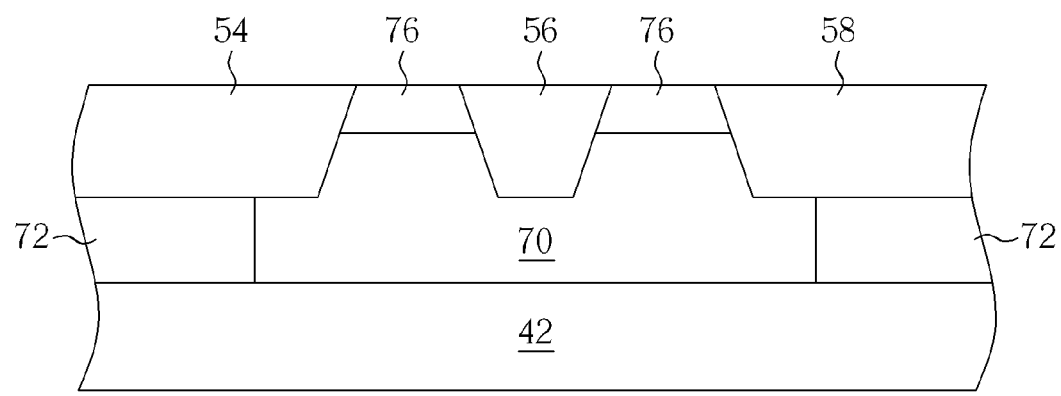

The die seal ring shown in FIG. 10 is structurally similar to the one shown in FIG. 9. As shown in FIG. 10, n-type ion implants are utilized to replace p-type ion implants to form a plurality of N+ doping regions 76 between the shallow trench isolations 54, 56, 58. Viewing from a structural perspective, the N+ doping regions 76 are disposed between the shallow trench isolations 54, 56, 58, the n-well 70 is disposed under the N+ doping regions 76 and the shallow trench isolations 54, 56, 58, and the p-well 72 is disposed directly under the shallow trench isolations 54, 58 while surrounding the n-well 70. As the n-well 70 and N+ doping regions 76 are composed of dopants of same conductive type, energy difference is only found between the n-well 70 and the surrounding p-well 72 in this embodiment.

Figure 11:
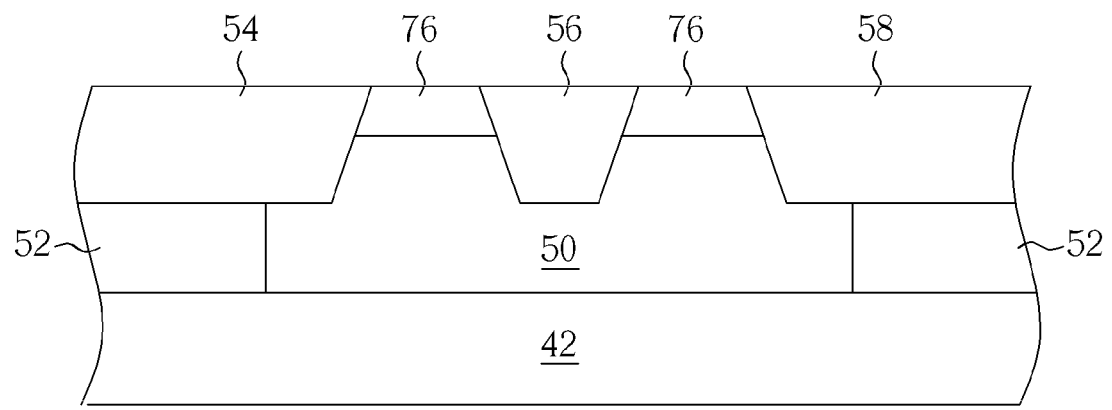

The die seal ring shown in FIG. 11 is similar to the one shown in FIG. 3. As shown in FIG. 11, n-type ion implants are utilized to replace p-type ion implants for forming a plurality of N+ doping regions 76 between the shallow trench isolations 54, 56, 58. Viewing from a structural perspective, the N+ doping regions 76 is disposed between the shallow trench isolations 54, 56, 58, the p-well 50 is disposed under the N+ doping region 76 and the shallow trench isolations 54, 56, 58, and the n-well 52 is disposed directly under the shallow trench isolations 54, 58 while surrounding the p-well 50. In this embodiment, an energy difference is found in a PN junction formed between the p-well 50 and the surrounding n-well 52 and another PN junction formed between the p-well 50 and the N+ doping region 76.

Figure 12:
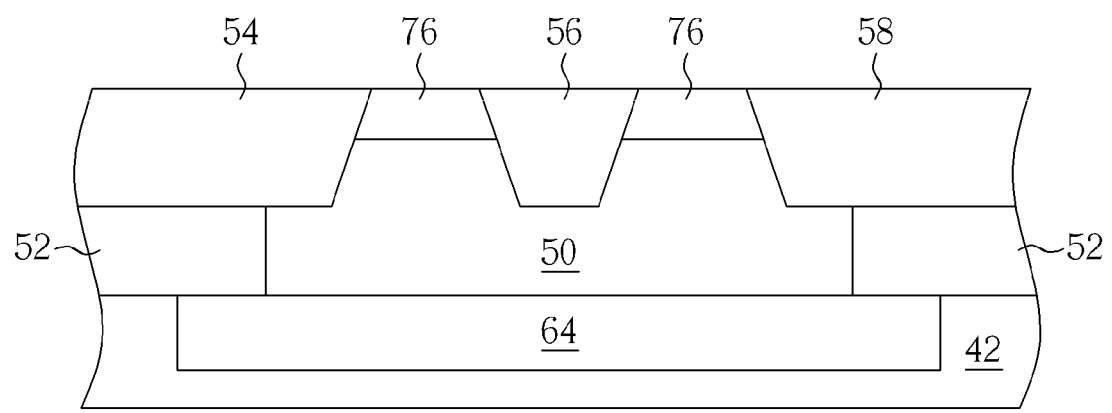

The die seal ring shown in FIG. 12 is preferably a combination of the die seal ring structure shown in FIG. 11 and the deep n-well disclosed previously. Viewing from a structural perspective, the N+ doping region 76 is disposed between the shallow trench isolations 54, 56, 58, the p-well 50 is disposed under the N+ doping region 76 and the shallow trench isolations 54, 56, 58, the n-well 52 is disposed directly under the shallow trench isolations 54, 58 while surrounding the p-well 50, and a deep n-well 64 is disposed under the p-well 50 and a portion of the n-well 52. In this embodiment, PN junctions are formed between the p-well 50 and the N+ doping region 76, n-well 52, and deep n-well 64 and energy difference created in these PN junctions could be utilized to inhibit noise to travel from the I/O pads 48 of the die region 44 through the die seal ring. It should be noted that the fabrication processes disclosed in this embodiment could be conducted independently or along with semiconductor fabrication processes conducted in the circuit region. For instance, a plurality of contact plugs (not shown) could be formed to electrically connect to the P+ doping regions 74 or N+ doping regions 76, which is also within the scope of the present invention.

Figure 13:
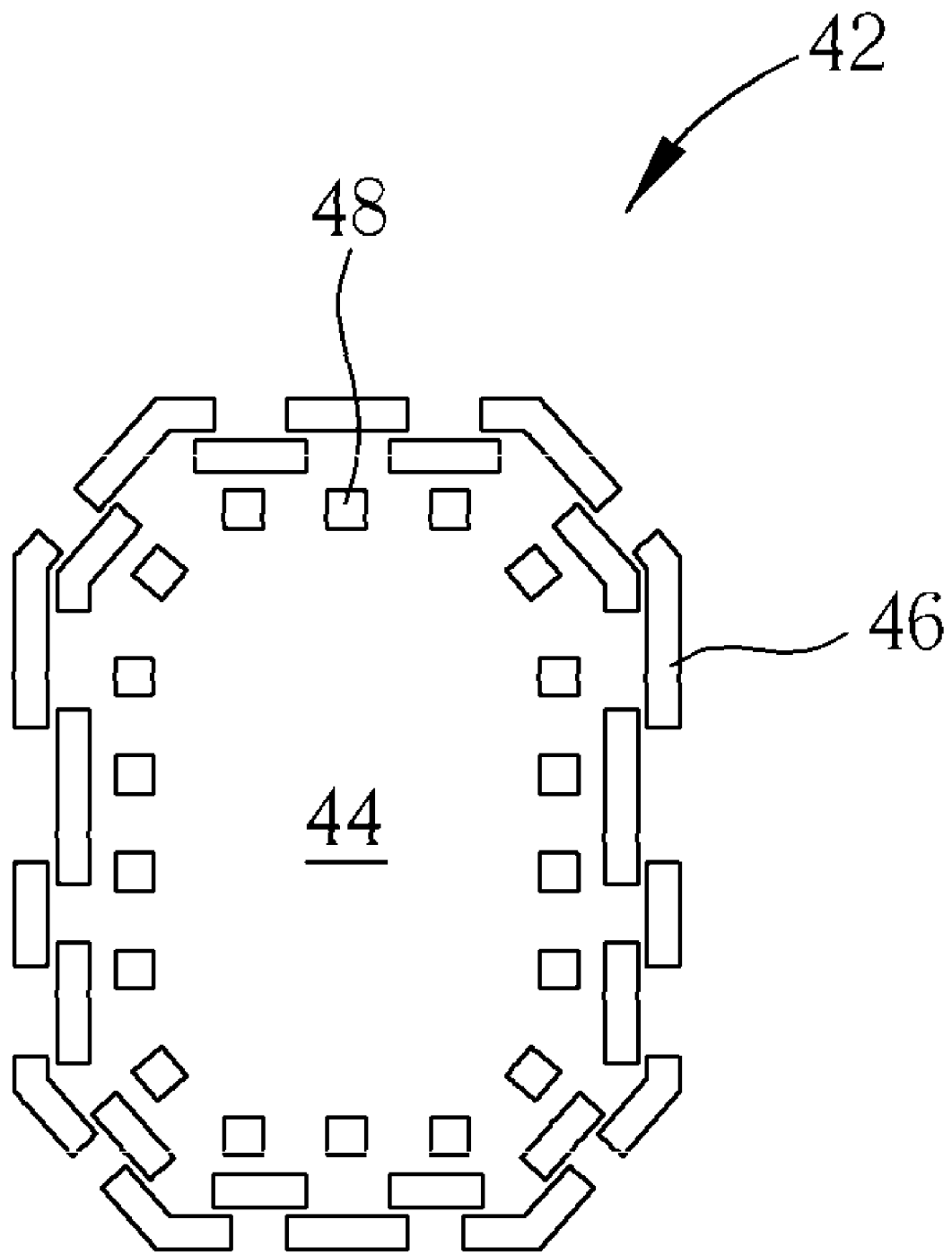
FIG. 13 illustrates a top view of a die seal ring according to an embodiment of the present invention.

Referring to FIG. 13, FIG. 13 illustrates a top view of a die seal ring according to an embodiment of the present invention. As shown in FIG. 13, in addition to the continuous type of die seal ring disclosed in the aforementioned embodiments, a staggered formation could also be utilized to fabricate the die seal ring region 46 of the present invention. By enclosing the die region 44 with a staggered type die seal ring region 46, noise passed from the die region 44 could be effectively prevented. Moreover, this staggered formation could be utilized independently in the die seal ring region 46 or combined with aforementioned die seal ring structures. For instance, the die seal ring structure having wells and doping regions of different conductive type as disclosed in the previous embodiments could be applied with a staggered formation structure, which is within the scope of the present invention.

Overall, the present invention specifically forms wells of different conductive type, such as a p-well and an n-well under shallow trench isolations and in the semiconductor substrate of the die seal ring region. Preferably, energy difference created between these wells of different conductive type could be used to block noise transmitted from the die region. Moreover, doping regions of different conductive type and Schottky contacts could be formed on top of the aforementioned wells and between the shallow trench isolations, and deep wells of deeper depths could be formed under the aforementioned wells. The doping regions, wells, and deep wells could be composed of dopants of same or difference conductive type depending on the design of the product.

Those skilled in the art will readily observe that numerous modifications and alterations of the device and method may be made while retaining the teachings of the invention.

What is claimed is:

1. A die seal ring, disposed outside of a die region of a semiconductor substrate, comprising:
    a first insulator, a second insulator, and at least one third insulator disposed between the first insulator and the second insulator;
    a plurality of first regions between the first insulator, the second insulator and the third insulator;
    a second region under the first region and the third insulator; and
    a third region only disposed under the first insulator and the second insulator, wherein the second region directly contacts the first regions, the third region, the first insulator, the second insulator, and the third insulator; and the third region comprises an n-type well.

2. The die seal ring of claim 1, wherein the first region and the second region comprise dopants of different conductive type.

3. The die seal ring of claim 1, wherein the first region and the second region comprise dopants of same conductive type.

4. The die seal ring of claim 1, wherein the second region and the third region comprise dopants of different conductive type.

5. The die seal ring of claim 1, further comprising a fourth region under the second structure.

6. The die seal ring of claim 5, wherein the second region and the fourth region comprise different dopants of different conductive type.

7. The die seal ring of claim 5, wherein the third region and the fourth region comprise dopants of same conductive type.

8. The die seal ring of claim 5, wherein each of the third region and the fourth region comprise a n-well, a p-well, a combination of n-well and p-well, or a p-type semiconductor substrate.

9. The die seal ring of claim 5, further comprising a fifth region under at least a portion of the second region, the third region, or the fourth region.

10. The die seal ring of claim 9, wherein the second region and the fifth region comprise dopants of different conductive type.

11. The die seal ring of claim 9, wherein the second region and the fifth region comprise dopants of same conductive type.

12. The die seal ring of claim 9, wherein the third region, the fourth region, and the fifth region comprise dopants of same conductive type.

13. The die seal ring of claim 9, wherein the fifth region comprises a n-well.

14. The die seal ring of claim 1, wherein the first region comprises a N+ doping region, a P+ doping region, or a Schottky contact.

15. The die seal ring of claim 1, wherein the second region is a n-well, a p-well, or a p-type semiconductor substrate.

16. The die seal ring of claim 1, wherein the die seal ring comprises a staggered formation.

17. The die seal ring of claim 1, further comprising a plurality of contact plugs connected to the first regions.

18. The die seal ring of claim 1, wherein the first insulator, the second insulator, and the third insulator comprise shallow trench isolations.

* * * * *